(12) United States Patent
Liu et al.

(10) Patent No.: US 9,311,441 B2
(45) Date of Patent: Apr. 12, 2016

(54) SWITCH CELL

(71) Applicant: Synopsys Taiwan Co., Ltd., Taipei (TW)

(72) Inventors: Jui-Hsiang Liu, Miaoli (TW); Hsin-I Lin, Hsinchu (TW); Tung-Chieh Chen, Hsinchu (TW)

(73) Assignee: Synopsys Taiwan Co., Ltd., Taipei (TW)

( * ) Notice: Subject to any disclaimer, the term of this patent is extended or adjusted under 35 U.S.C. 154(b) by 0 days.

(21) Appl. No.: 14/541,359

(22) Filed: Nov. 14, 2014

(65) Prior Publication Data

US 2015/0143322 A1 May 21, 2015

Related U.S. Application Data

(60) Provisional application No. 61/904,599, filed on Nov. 15, 2013.

(51) Int. Cl.
*G06F 17/50* (2006.01)

(52) U.S. Cl.
CPC ........ *G06F 17/5072* (2013.01); *G06F 17/5077* (2013.01)

(58) Field of Classification Search
CPC .................................................. G06F 17/5072
USPC ........................................................ 716/122
See application file for complete search history.

(56) References Cited

U.S. PATENT DOCUMENTS

| | | | |
|---|---|---|---|
| 6,789,246 B1* | 9/2004 | Mohan et al. | 716/112 |
| 2004/0123263 A1* | 6/2004 | Chen et al. | 716/18 |
| 2004/0133868 A1* | 7/2004 | Ichimiya | 716/10 |

* cited by examiner

*Primary Examiner* — Suchin Parihar
(74) *Attorney, Agent, or Firm* — Alston & Bird LLP

(57) ABSTRACT

A designer uses an option device to switch one or more signal flows in a schematic design to create different versions for the same design. Currently, there is no related automatic tool for the automatic placement of option devices. In various embodiments, option device instances are used to decide option device positions. Option devices can be automatically placed and routing considered and adjusted as needed.

17 Claims, 16 Drawing Sheets

OPTION DEVICES 500

SCHEMATIC

LAYOUT

SWITCH CELL

CROSS-REFERENCES TO RELATED APPLICATIONS

This Application claims the benefit of and priority to U.S. Provisional Patent Application No. 61/904,599, filed Nov. 15, 2013, and entitled "Switch Cell," the entire disclosure of which is hereby incorporated by reference.

BACKGROUND OF THE INVENTION

1. Field of the Invention

The present disclosure relates to electronic-design-automation (EDA) techniques. More specifically, the present disclosure relates to technique for placing option devices to switch signal flows in schematic designs allowing different versions for the same design to be created.

2. Related Art

As semiconductor technology is scaled to ever smaller dimensions, there are commensurate increases in the complexity of circuit designs. For example, smaller dimensions typically result in circuit designs having an increased number of logic gates and time domains. Moreover, this increase in complexity typically results in a significant increase in the time and cost needed to design circuits.

Circuit design fundamentally has two components: abstraction of the functionality of the circuit via computer models, and the actual physical rendering and implementation or rendering of the design. The development of any given design progresses from one phase to the next; from functional abstraction via computer modeling to physical rendering. In this progression, there becomes a point where the lines between the two are blurred. Aspects of the physical implementation have to be accounted for in the functional computer modeling; and functional aspects of the circuit have to be accounted for in the physical implementation.

Traditionally, a designer uses option devices to switch signal flows in schematic designs. The main purpose is to create different versions for the same design. A layout engineer can do routing first and replace part of a wire by specific open/close layer shapes. For designs that include a significant number of option devices, placement can dominate the routing requiring a user to manually replace parts of routing wires or manually place option devices.

Accordingly, what is desired is to solve problems relating to option device placement, some of which may be discussed herein. Additionally, what is desired is to reduce drawbacks relating to option device placement, some of which may be discussed herein.

BRIEF SUMMARY OF THE INVENTION

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

In one embodiment, a method for optimizing layout of a circuit includes receiving, at one or more computer systems, information specifying one or more option devices within a schematic of the circuit. Placement of each of the option devices is determined in a layout of the circuit. Information is then generated indicative of the placement of each of the option devices in the layout of the circuit.

In certain embodiments, determining the placement of each of the option devices in the layout of the circuit may include determining the placement of at least one of the one or more option devices based on matching a pre-defined pattern set. Determining the placement of each of the option devices in the layout of the circuit may include determining the placement of at least one of the one or more option devices based on assigning at least one of the one or more option devices to a pin. The placement of the at least one of the one or more option devices may be performed to minimize wirelength. The placement of the at least one of the one or more option devices may be performed based on considering track priority.

In various embodiments, determining the placement of each of the option devices in the layout of the circuit may include adjusting the placement of at least one of the one or more option devices based on predetermined criteria. The placement of the at least one of the one or more option devices may be adjusted based on moving location or performing a rotation. The predetermined criteria may include at least one of DRC or routability.

In one embodiment, a non-transitory computer-readable medium stores program code executable by one or more processors associated with one or more computer systems for placing option devices within circuits. The non-transitory computer-readable medium includes code for receiving information specifying one or more option devices in a schematic associated with a circuit; code for determining where to place a first set of the one or more option devices in a layout for the circuit based on matching a pre-defined pattern set; code for determining where to place a second set of the one or more option devices in the layout for the circuit based on assigning option devices to pins; and code for determining whether to adjust the placement of option devices in the layout for the circuit based on predetermined criteria.

In certain embodiments, the code for determining the placement of each of the option devices in the layout of the circuit may include code for determining the placement of at least one of the one or more option devices based on matching a pre-defined pattern set. In another aspect, the code for determining the placement of each of the option devices in the layout of the circuit may include code for determining the placement of at least one of the one or more option devices based on assigning at least one of the one or more option devices to a pin. The placement of the at least one of the one or more option devices may be performed to minimize wirelength. In a further aspect, the placement of the at least one of the one or more option devices may be performed based on considering track priority.

In certain embodiments, the code for determining the placement of each of the option devices in the layout of the circuit may include code for adjusting the placement of at least one of the one or more option devices based on predetermined criteria. The placement of the at least one of the one or more option devices may be adjusted based on moving location or performing a rotation. The predetermined criteria may include at least one of DRC or routability.

A further understanding of the nature of and equivalents to the subject matter of this disclosure (as well as any inherent or express advantages and improvements provided) should be realized in addition to the above section by reference to the remaining portions of this disclosure, any accompanying drawings, and the claims.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

DETAILED DESCRIPTION OF THE INVENTION

Introduction

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, a graphical user interface and a computer-program product (i.e., software) for use with the computer system are described. A circuit designer may use these systems, devices, and/or techniques to configure and monitor the execution of tasks in a user-configurable electronic-design-automation (EDA) flow associated with a circuit or circuit design. In particular, using an intuitive and interactive graphical user interface in EDA software, the circuit designer can configure and initiate execution of the EDA flow. Then, during execution of EDA tasks in the EDA flow, an execution monitor in the graphical user interface may provide a graphical representation of real-time execution status information for the EDA tasks. Moreover, using the EDA software, the circuit designer can debug the circuit design if any errors or problems occur.

By providing real-time feedback on progress and any problems, these devices and techniques can improve: project visibility, productivity and/or predictability. For example, using these devices and techniques, chip designers can design circuits or chips that are manufacturing ready in a single-pass design cycle. Consequently, these devices and techniques may make it easier for chip designers to design circuits or chips, which can decrease the time and cost of circuit or chip design, thereby increasing customer satisfaction and retention.

Figure 1:
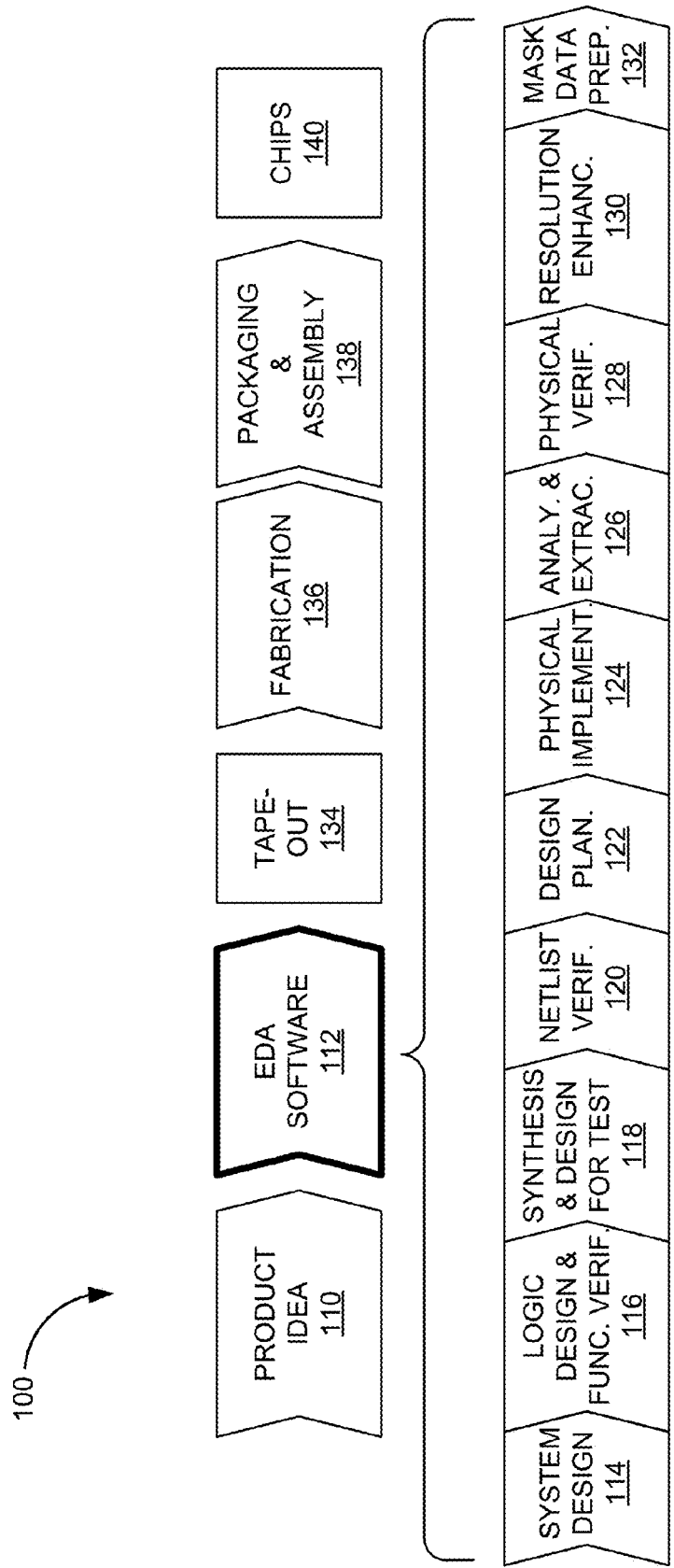
FIG. 1 is a flowchart illustrating various operations in the design and fabrication of an integrated circuit in accordance with an embodiment of the present disclosure.

Embodiments of design and fabrication of integrated circuits or chips are now described with reference to FIG. 1. FIG. 1 is flowchart 100 illustrating the various operations in the design and fabrication of an integrated circuit. This process starts with the generation of a product idea (110), which is realized during a design process that uses electronic design automation (EDA) software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® and IC Compiler® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® product.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus®AF, and PSMGED® products.

Additionally, during mask-data preparation (132), the "tape-out" data for production of masks to produce finished chips is provided. Exemplary EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software that includes operations between design (114) and resolution enhancement (130).

We now describe embodiments of a technique for design portion of the EDA flow. EDA software may provide interactive flow-control environment that includes EDA tools, utilities and automation which allow a user (such as a chip designer) to design a circuit or a chip, including: layout, node optimization, and EDA flows that include multiple EDA tasks or tool scripts. These EDA flows may include block-level flows and full-chip hierarchical flows, which act on a circuit or chip design (which is henceforth referred to as a circuit design).

To accelerate circuit development using the EDA software, the user may use a variety of preconfigured or predefined content, including EDA tool scripts with default technology settings and/or default flows associated with blocks in the circuit design. However, the EDA software also supports user-defined technology settings and block configurations (i.e., the EDA software is programmable).

In general, a particular design may be specified by a corresponding user-configurable EDA flow, which includes a sequence of blocks having associated block flows and sub-block or step flows. A given block in the sequence of blocks may include one or more sub-block flows, and a given sub-block in the sub-block flow may represent a sequence of EDA tasks that are performed on a circuit design.

In the discussion that follows, an EDA task is defined as an EDA tool script that performs a single or small number of related commands on a circuit design. For example, the EDA tasks may include: an elaborate script, a synthesis script, a clock route script, a design-implementation script, a design-optimization script, a design-analysis script, etc. In contrast with operating-system processes, these commands operate on a circuit design. Note that each EDA task may involve multiple operating-system processes.

Moreover, a step flow (or a sub-block flow) is defined as a collection or sequence of inter-coupled EDA tasks that operate on the circuit design. In general, step flows are grouped into functional areas such as: synthesis, floor planning, place and route, chip finishing, etc.

Additionally, a block flow is defined as a collection or sequence of inter-coupled step flows that complete at least a portion of the circuit design. Note that block flows can be hierarchical flows (e.g., flows that have a treed structure with a root level and one or more dependent branches). Furthermore, many circuit designs are specified as a sequence of inter-coupled blocks (and their associated flows).

The EDA software can include foundry-ready technology, designs and libraries, such as EDA tool scripts and flow templates that are preconfigured based at least in part on the requirements associated with particular semiconductor manufacturers or manufacturing facilities, and which are already validated. In addition, the EDA software may provide preconfigured foundry-specific checklists and documentation to assist the user in prompt and successful tape-out of the circuit design.

In order to improve product visibility (and, thus, user productivity), the EDA software may also support the generation of on-demand management reports, including real-time queries during the execution of a user-configurable EDA flow. These reports may be user configured, and may allow the user to monitor performance metrics, such as: area utilization, clock speed, power consumption, and/or any errors that occur during execution of the user-configurable EDA flow.

Switch Cell Placement

As used herein, an "switch cell" is also called an "option cell" or "option device." In general, a designer uses an option device to switch one or more signal flows in a schematic design. The purpose is to create different versions (e.g., alternative layouts) for the same design. A layout engineer can perform routing first and then replace part of a wire by specific open/close layer shapes. The user typically manually replaces part of routing wires or manually places the option devices. Currently, there is no related automatic tool for the automatic placement of option devices that incorporate features disclosed herein.

In various embodiments, instances of an option device are used to decide option device positions and routing topology. Accordingly, option devices can be automatically placed within a proposed layout and routing considered and adjusted as needed.

Figure 2A:
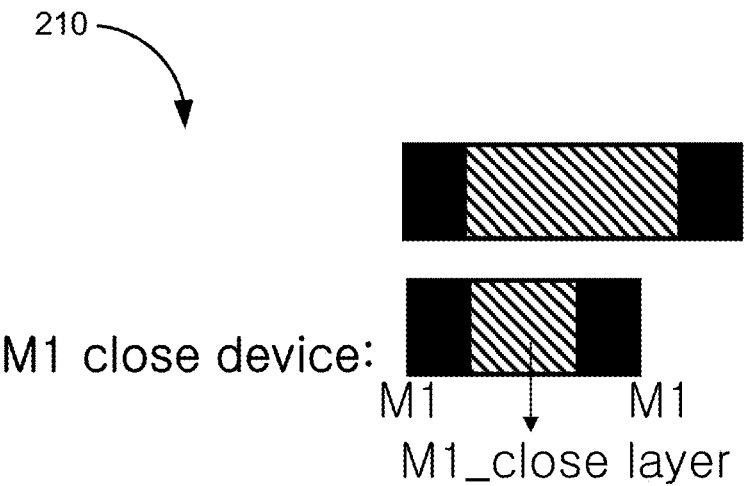
FIGS. 2A and 2B are examples of layouts for option device instances in one embodiment.
Figure 2B:
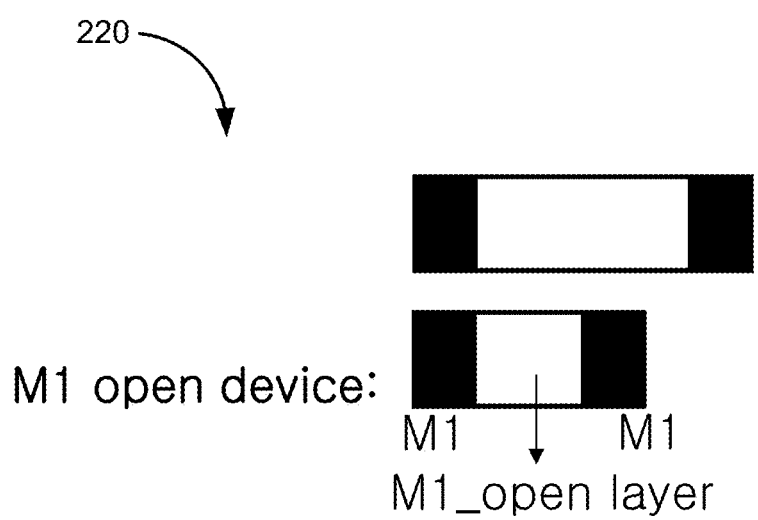

FIGS. 2A and 2B are examples of layouts for option device instances in one embodiment. In this example, option device instances 210 and 220 contain two ports connecting different nets. The internal option layer of instances 210 and 220 decide short and open between the ports. The option layer length can be adjusted and has a minimum/maximum length constraint. In some aspects, the option layer can be metal or a user-defined layer. FIG. 2A illustrates instance 210 of a closed option device in one embodiment. FIG. 2B illustrates instance 220 of an open option device in one embodiment.

Figure 3:
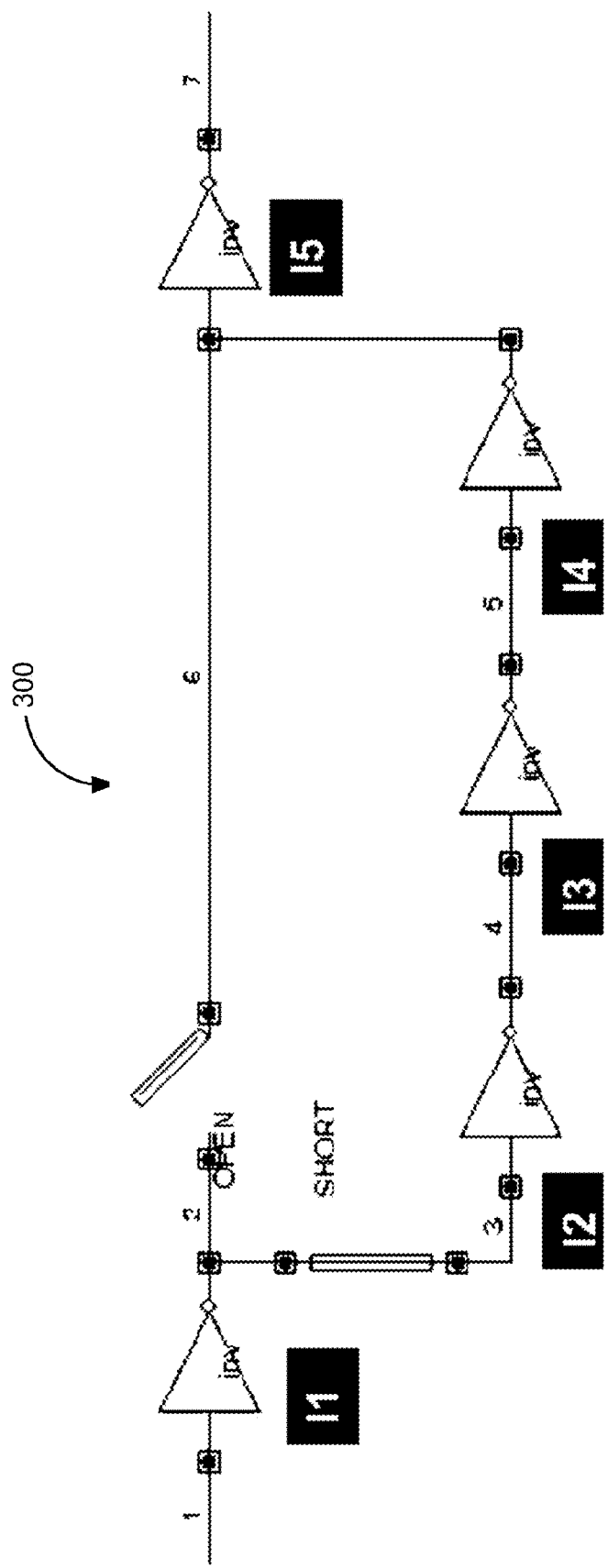
FIG. 3 is an illustration of a SHORT/OPEN option device in one embodiment.
Figure 4A:
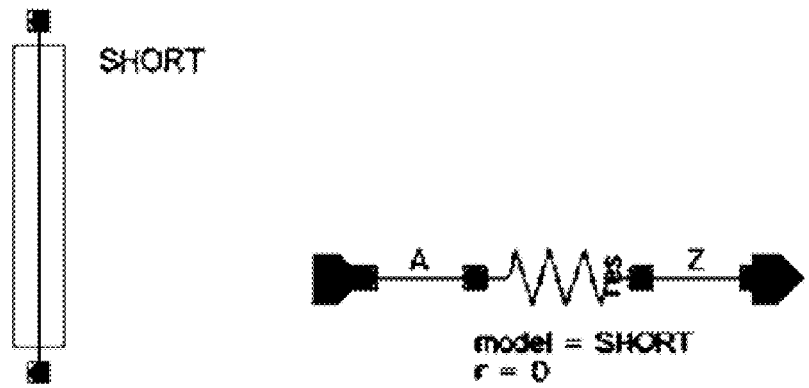
FIG. 4A is an illustration of an option device in the SHORT position in one embodiment.
Figure 4B:
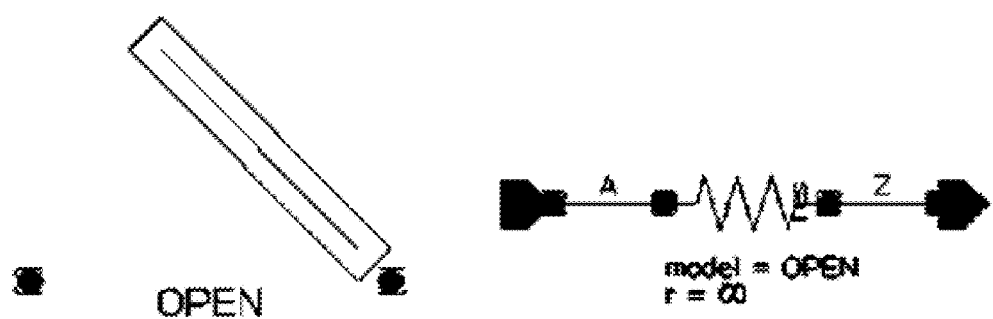
FIG. 4B is an illustration of an option device in the OPEN position in one embodiment.

FIG. 3 is an illustration of SHORT/OPEN option device 300 in one embodiment. In this example, option device 300 is illustrated using schematic modeling. FIG. 4A is an illustration of option device 300 in the SHORT position in one embodiment. FIG. 4B is an illustration of option device 300 in the OPEN position in one embodiment.

Figure 5A:
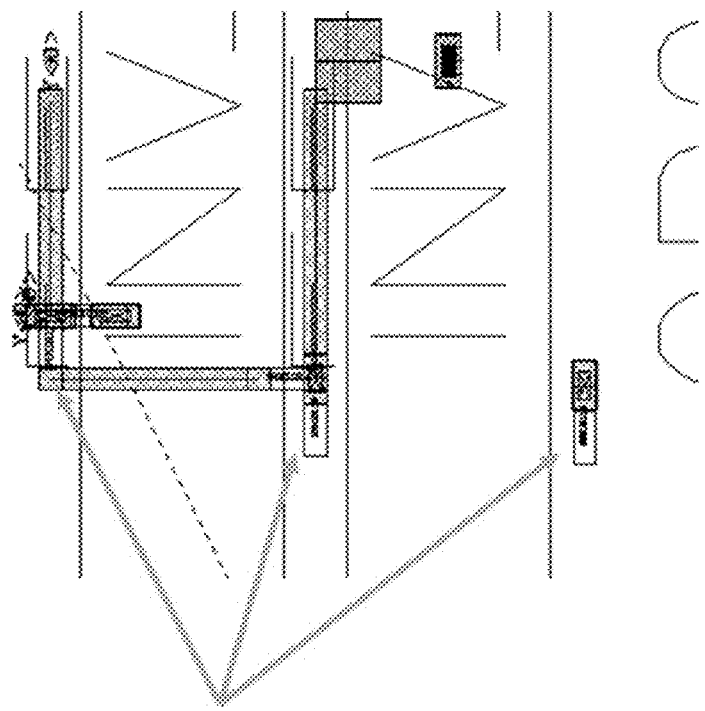
FIG. 5A is an illustration of an option device in a proposed layout in one embodiment.
Figure 5B:
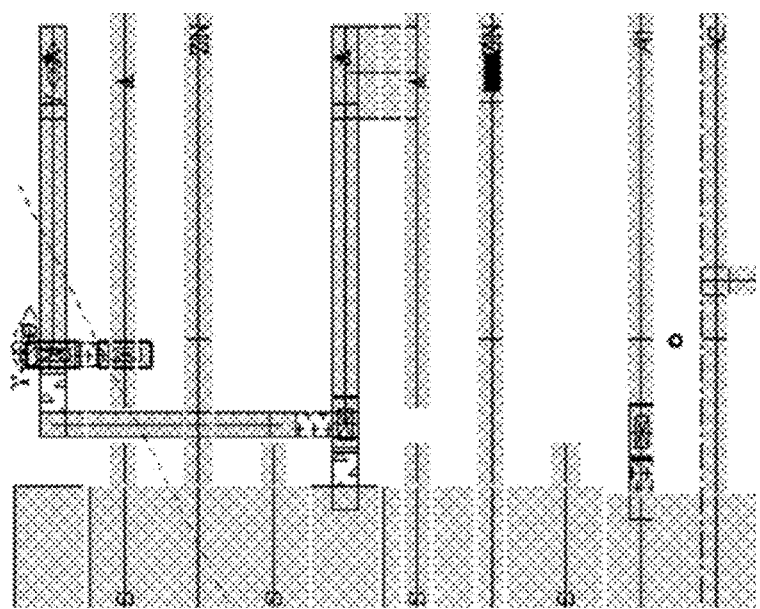
FIG. 5B is an illustration of an option device in an OPEN layer and a CLOSED layer of a proposed layout in one embodiment.

FIG. 5A is an illustration of option devices 500 in another embodiment. In this example, option devices 500 are illustrated in one layer of a proposed layout. FIG. 5B illustrates option devices 500 in an OPEN layer and a CLOSED layer of the proposed layout.

Therefore, a designer can use an option device to switch one or more signal flows in a schematic design to create different versions (e.g., alternative layouts) for the same design. An automatic tool is provided for the automatic placement of option devices.

Switch Cell Placement Flow

Figure 6:
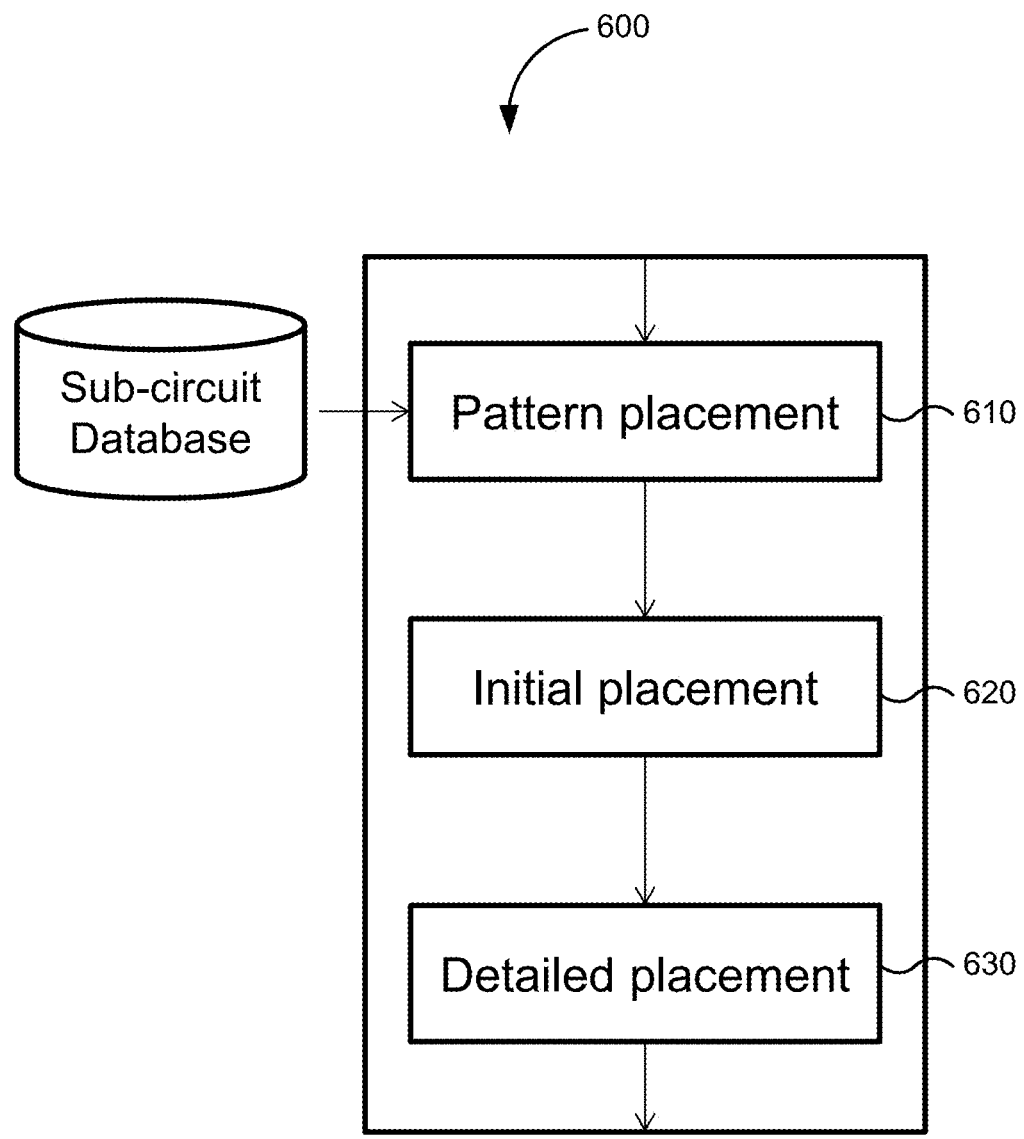
FIG. 6 is a block diagram for an option device placement flow in one embodiment according to the present invention.

FIG. 6 is a block diagram for option device placement flow 600 in one embodiment according to the present invention. Implementations of or processing in flow 600 depicted in FIG. 6 may be performed by software (e.g., instructions or code modules) when executed by a central processing unit (CPU or processor) of a logic machine, such as a computer system or information processing device, by hardware components of an electronic device or application-specific integrated circuits, or by combinations of software and hardware elements. Flow 600 depicted in FIG. 6 begins in step 610.

In step 610, pattern placement is performed. In one example, a netlist is traversed to extract a set of option devices from a pre-defined pattern set. Each extracted option device can then be placed. In certain embodiments, information may be retried from a sub-circuit database.

Figure 7A:
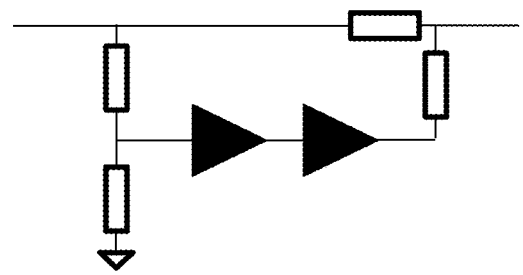
FIGS. 7A and 7B illustrate pattern placement in one embodiment.
Figure 7B:
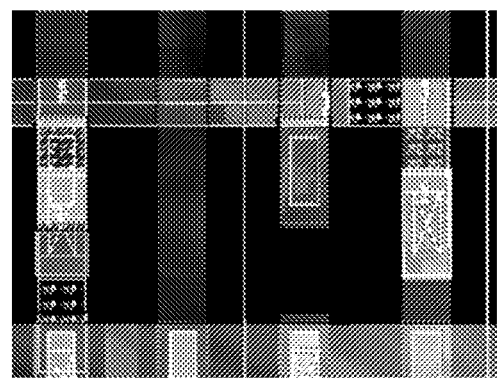

In one aspect, a specific option device related to a sub-circuit is matched from the whole netlist. Option devices can be assigned to standard cell pins according to the defined pattern. The option devices may be detail placed to avoid DRC violation, such as trying different tracks or rotation for DRC. Users can define their own sub-circuit in the database. FIGS. 7A and 7B illustrate pattern placement in one embodiment.

In step 620, initial placement is performed. Here, remaining option devices are assigned to instance pins according to one or more predetermined criteria, such as wirelength.

In one embodiment, the X-coordinate of the remaining option devices is decided. In one aspect, for option devices that are assigned to the standard cell pins, the center of standard cell pins may become the X-coordinate for these option devices. Option device assignment is not limited to the center of standard cell pins however. In another aspect, the X-coordinate for an option device may be assigned based on priority, for example, the number of option devices it connects (e.g., from less to more). In yet another aspect, the X-coordinate for an option device may be decided based on cost to decide the standard cell pins. For example, the length of the nets of the option device (e.g., from short to long). Once an option device is assign to a standard cell pin, another option device can be assigned to this option device since the X-coordinate is decided.

The Y-coordinate of an option devices is also decided. In one aspect, the Y-coordinate can be one of the horizontal track of the option device pin layer. An initial placement flow may go through every track and try to place the option devices on a net. The track sequence can be determined according to track priority, which is typically predefined and based on a designer's requirement. In one aspect, a determination is made whether the track has enough continuous free space to place and connect any option devices. Placement can also be made based on determining that the track space occupied guarantees routability.

The following provides pseudo-code for one embodiment of the initial placement flow of FIG. 6. In step 1, the X-coordinate of one or more option devices is decided.

```
Sort all net with option cell according to option device number
(from less to more).
For each net n with option cell
    For each option cell opt of n
        bestCost = INFINITY
        For each pin p connected to opt
            Place x coordinate opt to center of p
            cost = estimated net length connected to opt
            If (cost < bestCost) {
                bestCost = cost
            }
```

In step 1, the Y-coordinate of one or more option devices is decided.

```
For each net n with option cell
    Choose layer as the option device pin layer
    For each track t of layer from track priority setting
        If (t does not have free space to place and connect
        the option devices of n) {
            continue;
        }
        Occupied the track space to guarantee the routability
        For each option cell opt of n
            If (opt is placed by pattern placement or
            visitopt = true) {
                continue
            }
            Decide y coordinate of opt according to t
            Place opt according to x and y
            visitopt = true
```

In step 630, detailed placement is performed. Local adjustment of option devices may be performed considering factors such as DRC, routability, and the like. The detailed placement flow may optimize track number, wire length, via usage by local option cell movement and rotation. Compact option devices may be used to minimize track usage. Option device local refinement may be performed by looking at, L pattern for wire length, Parallel pattern for via number, Pin alignment. Flow 600 ends after step 630.

Figure 8A:
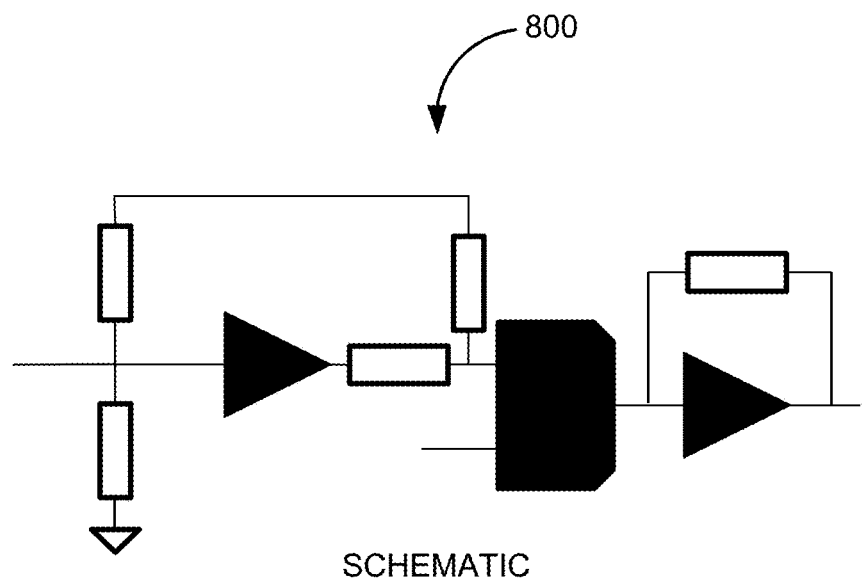
FIGS. 8A-8H provide an exemplary placement flow for a circuit in one embodiment.
Figure 8B:
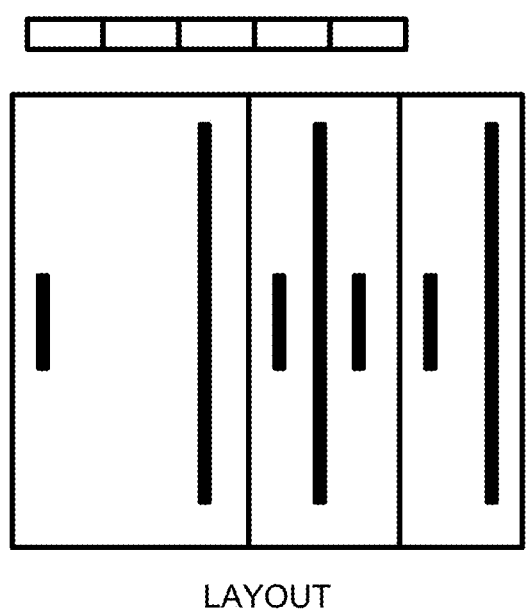

FIGS. 8A-8H provide an exemplary placement flow for circuit 800 in one embodiment. FIG. 8A illustrates a schematic view of circuit 800 in one embodiment. FIG. 8B illustrates layout of circuit 800 in one embodiment.

Figure 8C:
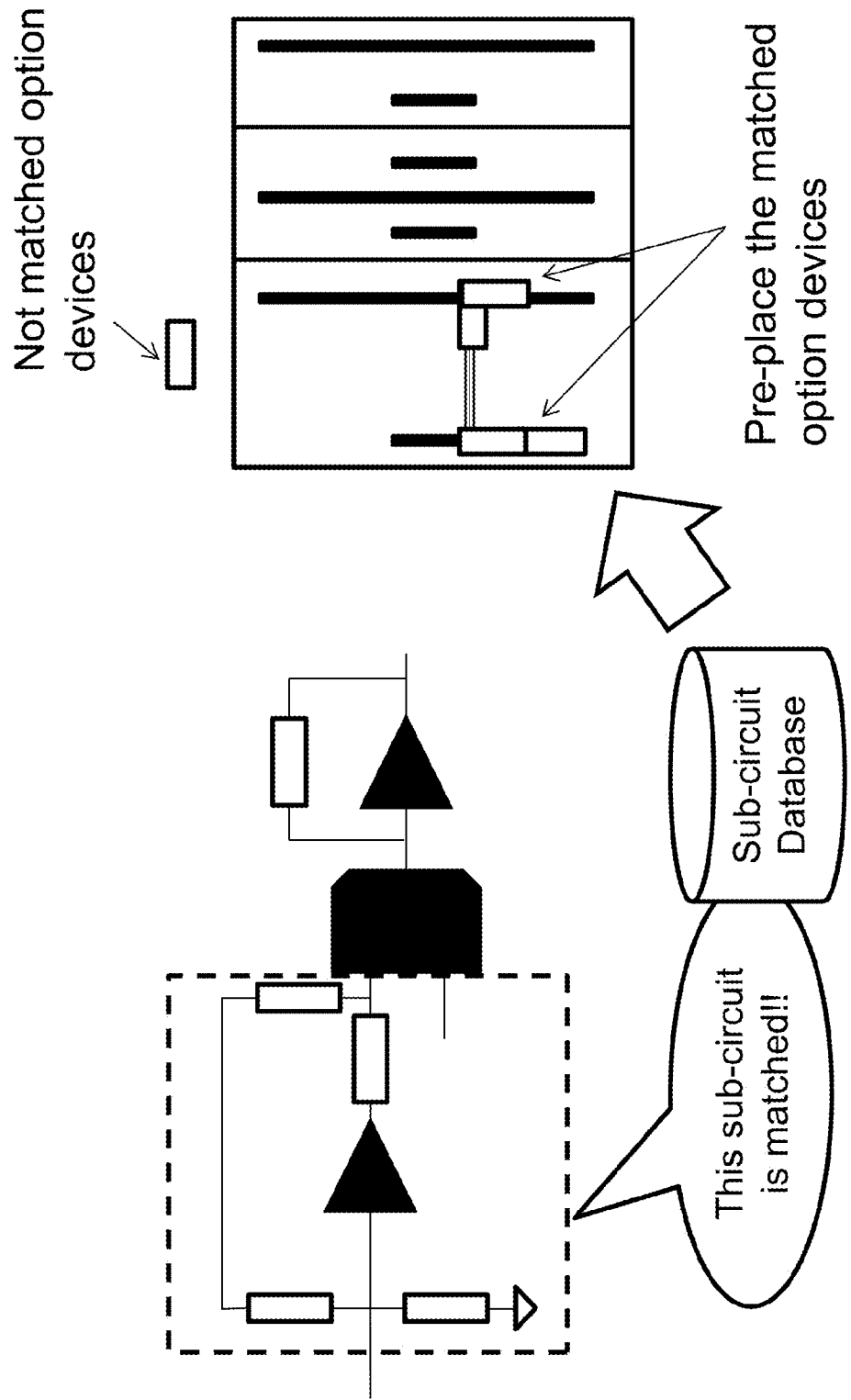

FIG. 8C illustrates pattern placement in one embodiment. In this example, a sub-circuit in the schematic view of circuit 800 is matched to a portion of circuit 800 in the layout view. Matched option devices are pre-placed in the layout. In this example, one option device remains after pattern placement.

Figure 8D:
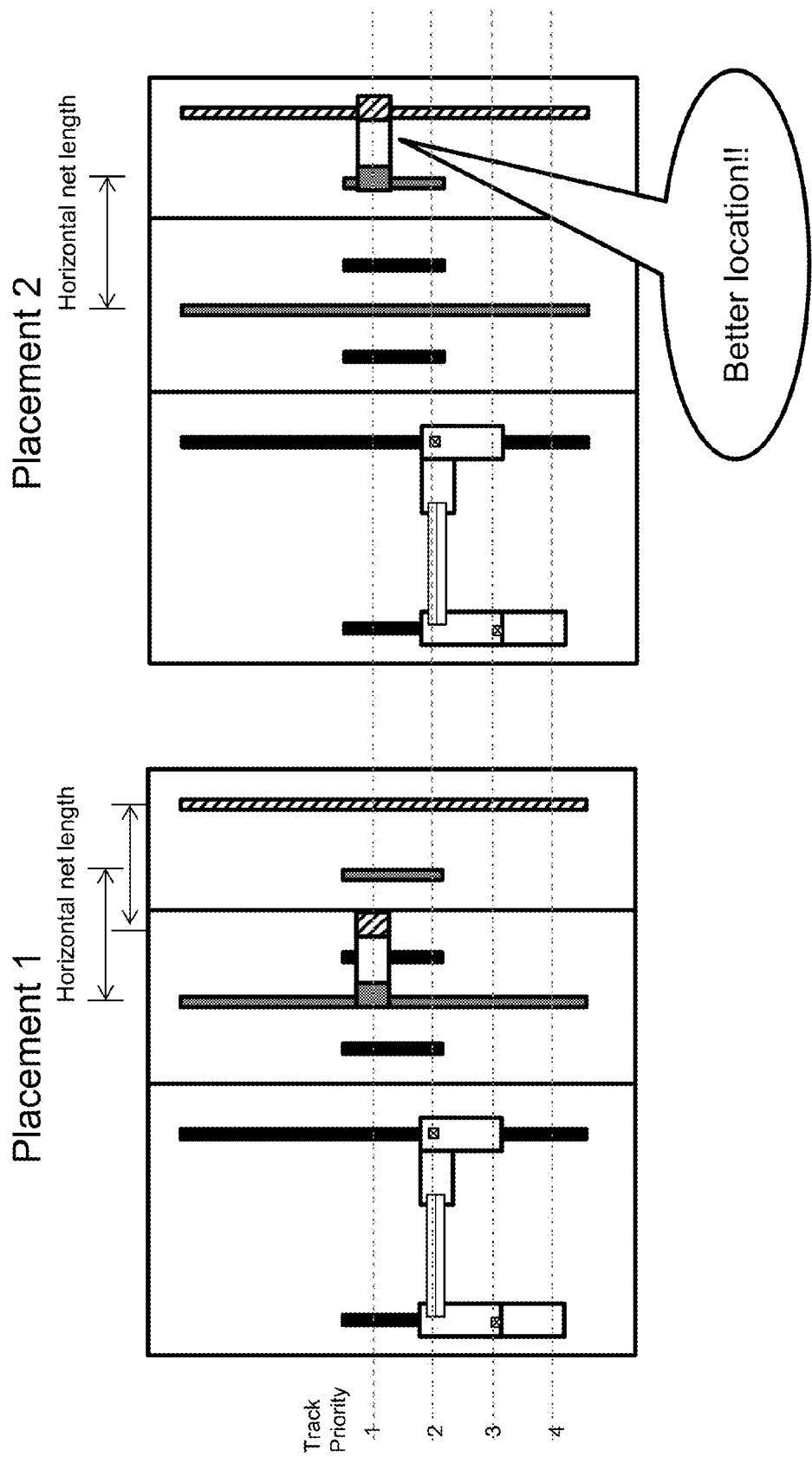

FIG. 8D illustrates initial placement in one embodiment. In this example, the initial placement flow may go through every track and try to place the remaining option devices on a net. The track sequence is according to the track priority (1-4). The track should have continuous free space to place and connect the option devices. The track space should also be occupied to guarantee the routability. For example, the remaining option cell is placed to track 1 according to the track priority. Then, the option cell is placed to right pin due to net length estimation, for example, as the wirelength in placement 1 is larger than placement 2.

Figure 8E:
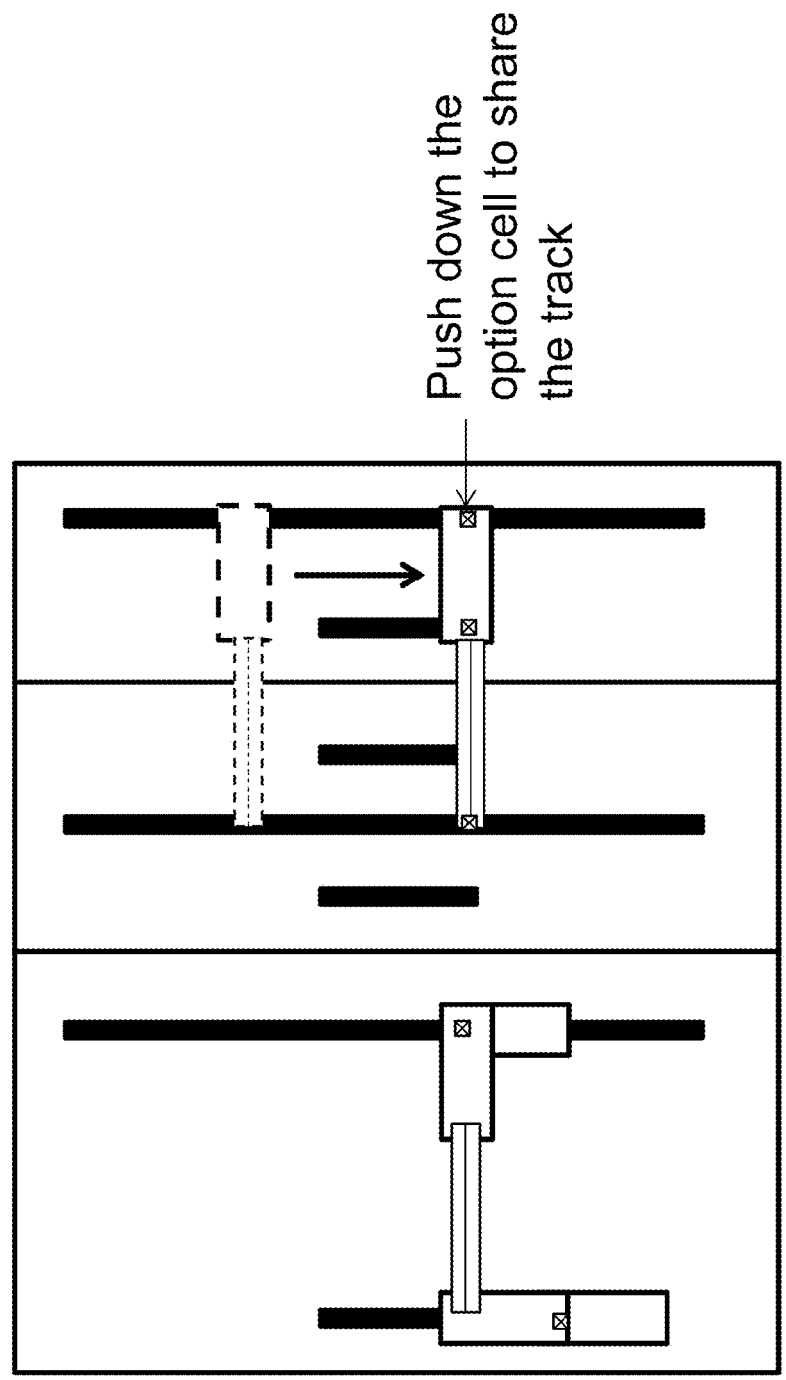

FIG. 8E illustrates detail placement in one embodiment. In this example, local adjustment of the option devices is performed considering factors such as DRC, routability, and track usage. The option devices may be pushed down to share the track.

Figure 8F:
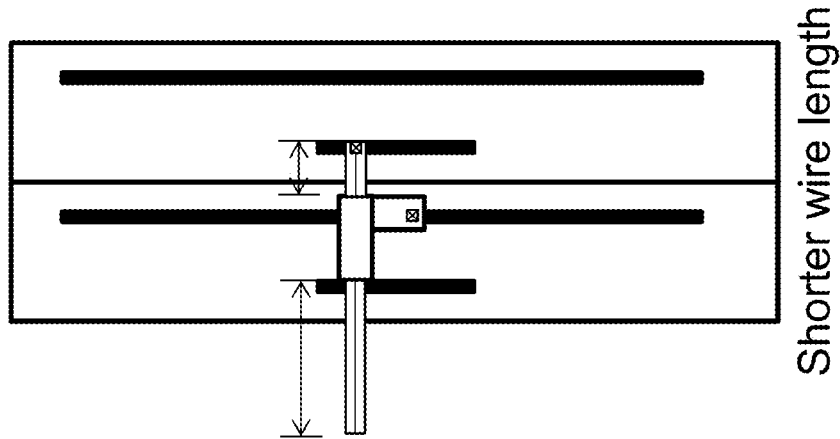
Figure 8F:
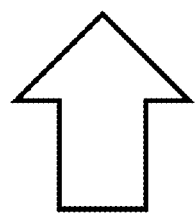
Figure 8F:
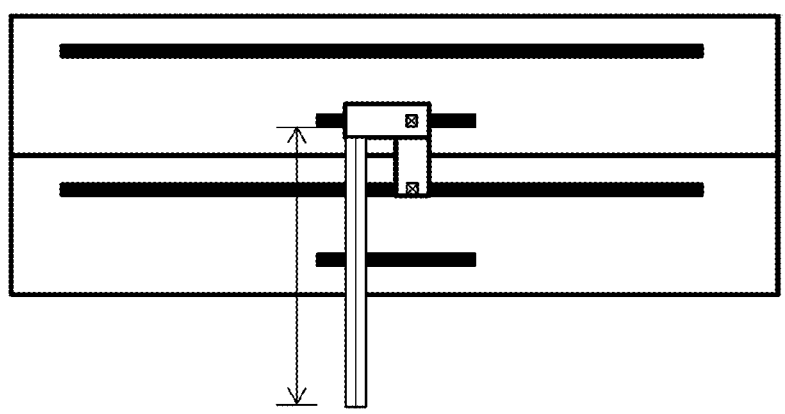

FIG. 8F provides a further example of detailed placement for an L pattern for wire length in one embodiment. In this example, placement of the option device having an L pattern is refined to result in a shorter wire length.

Figure 8G:
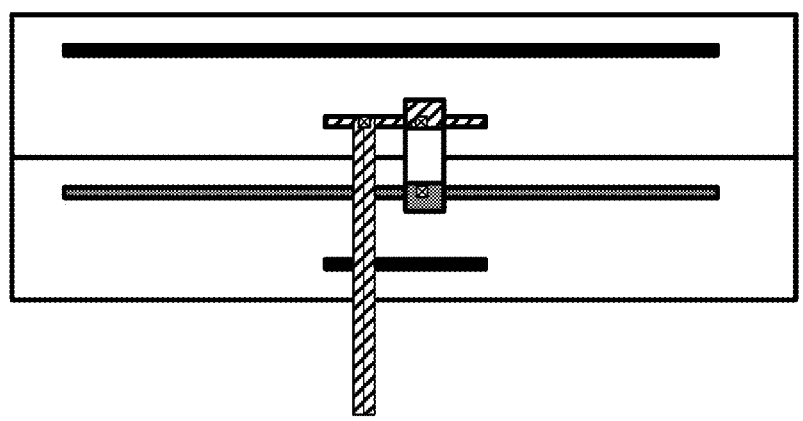
Figure 8G:
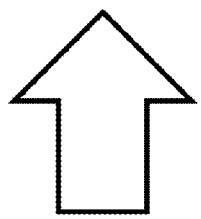
Figure 8G:
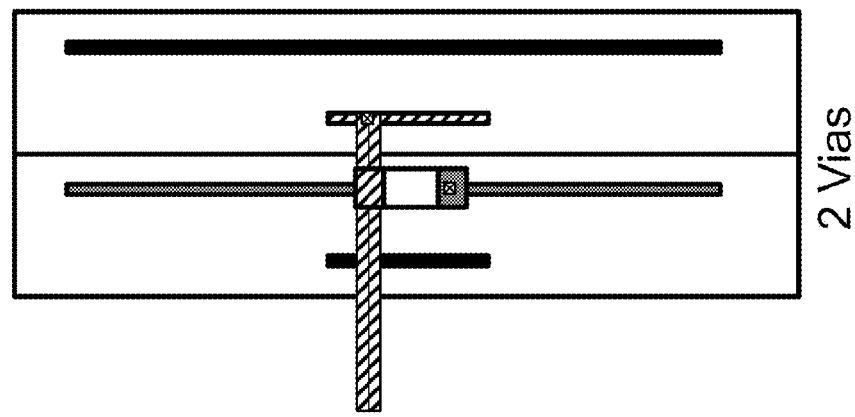

FIG. 8G provides a further example of detailed placement for a parallel pattern for via number in one embodiment. In this example, placement of the option device is refined to result a smaller number of vias.

Figure 8H:
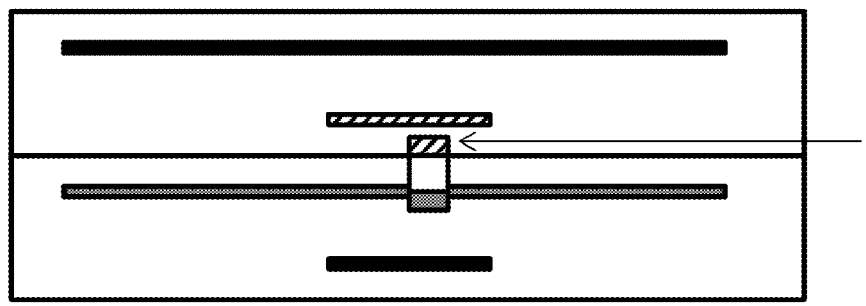
Figure 8H:
Figure 8H:
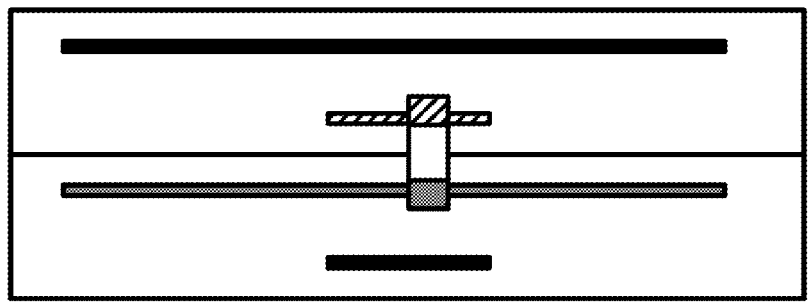

FIG. 8H provides a further example of detailed placement for pin alignment in one embodiment. In this example, placement of the option device is refined to align the option device to a pin.

Accordingly, in various embodiments, option device sub-circuit recognition and pattern placement is provided. One sub-circuit pattern may be proposed all the while allowing users to define their own sub-circuits and save them in a sub-circuit database. Option devices can be modeled, for example, using a two pin cell with various option layer lengths. In other aspects, option devices may be placed based on pin location to minimize estimated wire length. Additionally, option device location/rotation/length may be adjusted to DRC clean and consider routability. This may involve the consideration of track number in refining placement.

Figure 9:
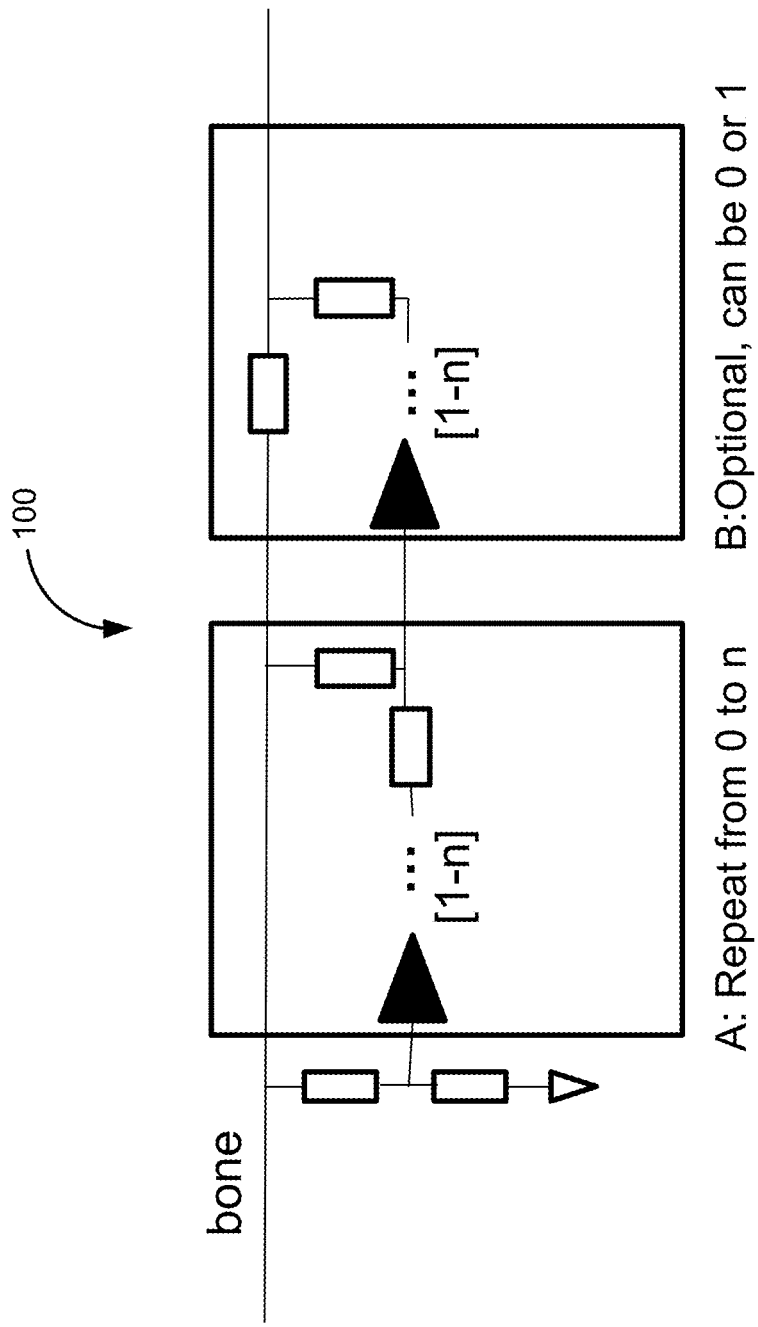
FIG. 9 illustrates a common option device pattern for which placement may be provided according to various embodiments of the present invention.

FIG. 9 provides a final example of a common option pattern for which placement may be provided according to various embodiments of the present invention.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

Figure 10:
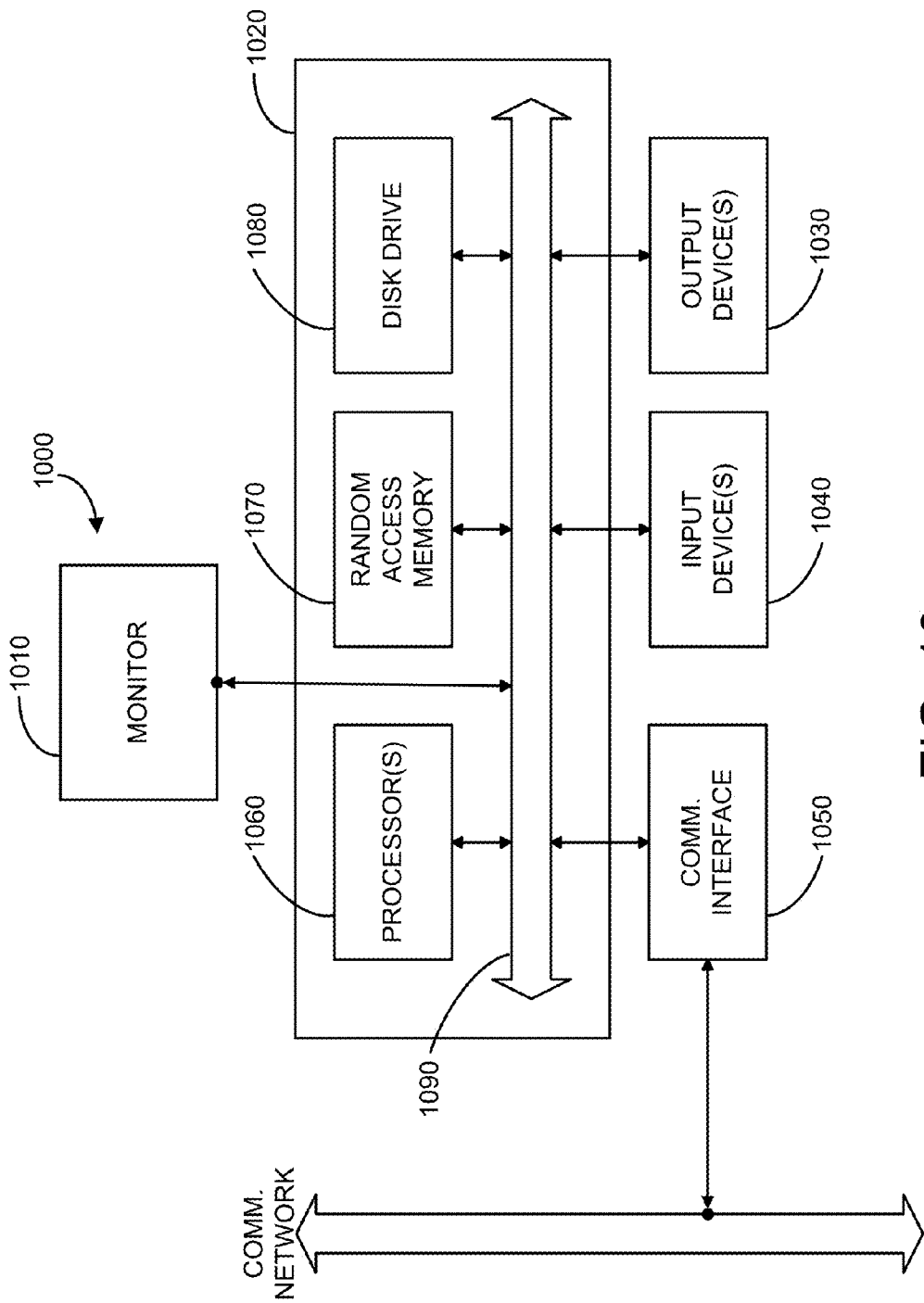
FIG. 10 is a simplified block diagram of a computer system that may incorporate embodiments of the present invention.

FIG. 10 is a simplified block diagram of a computer system 1000 that may incorporate embodiments of the present invention. FIG. 10 is merely illustrative of an embodiment incorporating the present invention and does not limit the scope of the invention as recited in the claims. One of ordinary skill in the art would recognize other variations, modifications, and alternatives.

In one embodiment, computer system 1000 typically includes a monitor 1010, a computer 1020, user output devices 1030, user input devices 1040, communications interface 1050, and the like.

As shown in FIG. 10, computer 1020 may include a processor(s) 1060 that communicates with a number of peripheral devices via a bus subsystem 1090. These peripheral devices may include user output devices 1030, user input devices 1040, communications interface 1050, and a storage subsystem, such as random access memory (RAM) 1070 and disk drive 1080.

User input devices 1040 include all possible types of devices and mechanisms for inputting information to computer system 1020. These may include a keyboard, a keypad, a touch screen incorporated into the display, audio input devices such as voice recognition systems, microphones, and other types of input devices. In various embodiments, user input devices 1040 are typically embodied as a computer mouse, a trackball, a track pad, a joystick, wireless remote, drawing tablet, voice command system, eye tracking system, and the like. User input devices 1040 typically allow a user to select objects, icons, text and the like that appear on the monitor 1010 via a command such as a click of a button or the like.

User output devices 1030 include all possible types of devices and mechanisms for outputting information from computer 1020. These may include a display (e.g., monitor 1010), non-visual displays such as audio output devices, etc.

Communications interface 1050 provides an interface to other communication networks and devices. Communications interface 1050 may serve as an interface for receiving data from and transmitting data to other systems. Embodiments of communications interface 1050 typically include an Ethernet card, a modem (telephone, satellite, cable, ISDN), (asynchronous) digital subscriber line (DSL) unit, FireWire interface, USB interface, and the like. For example, communications interface 1050 may be coupled to a computer network, to a FireWire bus, or the like. In other embodiments, communications interfaces 1050 may be physically integrated on the motherboard of computer 1020, and may be a software program, such as soft DSL, or the like.

In various embodiments, computer system 1000 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1020 includes one or more Xeon microprocessors from Intel as processor(s) 1060. Further, one embodiment, computer 1020 includes a UNIX-based operating system.

RAM 1070 and disk drive 1080 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1070 and disk drive 1080 may be configured to store the basic programming and data constructs that provide the functionality of the present invention.

Software code modules and instructions that provide the functionality of the present invention may be stored in RAM 1070 and disk drive 1080. These software modules may be executed by processor(s) 1060. RAM 1070 and disk drive 1080 may also provide a repository for storing data used in accordance with the present invention.

RAM 1070 and disk drive 1080 may include a number of memories including a main random access memory (RAM) for storage of instructions and data during program execution and a read only memory (ROM) in which fixed instructions are stored. RAM 1070 and disk drive 1080 may include a file storage subsystem providing persistent (non-volatile) storage for program and data files. RAM 1070 and disk drive 1080 may also include removable storage systems, such as removable flash memory.

Bus subsystem 1090 provides a mechanism for letting the various components and subsystems of computer 1020 communicate with each other as intended. Although bus subsystem 1090 is shown schematically as a single bus, alternative embodiments of the bus subsystem may utilize multiple busses.

FIG. 10 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other micro processors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A method for optimizing layout of a circuit, the method comprising:
    upon receipt of information specifying one or more option devices within a schematic of the circuit, determining, with one or more processors associated with one or more computer systems, placement of each of the one or more option devices in a layout of a circuit; and
    generating, with the one or more processor associated with the one or more computer systems, information indicative of the determined placement in the layout of the circuit of the one or more option devices creating a set of alternative layouts having automatically switching of one or more signal flows.

2. The method of claim 1 wherein determining, with the one or more processors associated with the one or more computer systems, the placement of each of the one or more option devices in the layout of the circuit comprises determining the placement of at least one of the one or more option devices based on matching a pre-defined pattern set.

3. The method of claim 1 wherein determining, with the one or more processors associated with the one or more computer systems, the placement of each of the one or more option devices in the layout of the circuit comprises determining the placement of at least one of the one or more option devices based on assigning at least one of the one or more option devices to a pin.

4. The method of claim 1 wherein the placement of the at least one of the one or more option devices is performed to minimize wirelength.

5. The method of claim 4 wherein the placement of the at least one of the one or more option devices is performed based on considering track priority.

6. The method of claim 1 wherein determining, with the one or more processors associated with the one or more computer systems, the placement of each of the one or more option devices in the layout of the circuit comprises adjusting the placement of at least one of the one or more option devices based on predetermined criteria.

7. The method of claim 6 wherein the placement of the at least one of the one or more option devices is adjusted based on moving location or performing a rotation.

8. The method of claim 6 wherein the predetermined criteria include at least one of DRC or routability.

9. A non-transitory computer-readable medium storing program code executable by one or more processors associated with one or more computer systems for placing option devices within circuits, the non-transitory computer-readable medium comprising:
    code for receiving information specifying one or more option devices in a schematic associated with a circuit;
    code for placing in a layout for the circuit a first set of the one or more option devices in the schematic associated with the circuit based on matching a pre-defined pattern set;
    code for placing in the layout for the circuit a second set of the one or more option devices in the schematic associated with the circuit based on assigning option devices to pins; and
    code for modifying a determined placement of each of a third set of the one or more option devices in the schematic associated with the circuit based on the determined placement satisfying predetermined criteria.

10. The non-transitory computer-readable medium of claim 9 wherein the code for placing the first set of the one or more option devices in the layout for the circuit based on matching the pre-defined pattern set comprises code for determining the placement of at least one of the one or more option devices based on matching a pre-defined pattern set.

11. The non-transitory computer-readable medium of claim 9 wherein the code for placing in the layout for the circuit the second set of the one or more option devices in the schematic associated with the circuit comprises code for determining the placement of at least one of the one or more option devices based on assigning at least one of the one or more option devices to a pin.

12. The non-transitory computer-readable medium of claim 11 wherein the placement of the at least one of the one or more option devices is performed to minimize wirelength.

13. The non-transitory computer-readable medium of claim 11 wherein the placement of the at least one of the one or more option devices is performed based on considering track priority.

14. The non-transitory computer-readable medium of claim 9 wherein the code for modifying the determined placement of each of the third set of the one or more option devices in the schematic associated with the circuit comprises code for adjusting a determined placement of at least one of the one or more option devices based on the predetermined criteria.

15. The non-transitory computer-readable medium of claim 14 wherein the placement of the at least one of the one or more option devices is adjusted based on moving location or performing a rotation.

16. The non-transitory computer-readable medium of claim 14 wherein the predetermined criteria include at least one of DRC or routability.

17. A system for placing option devices within circuits, the system comprising:
    a processor; and
    a memory configured to store a set of instructions that when executed by the processor configure the processor to:
    receive information specifying one or more option devices in a schematic associated with a circuit;
    determine where to place a first set of the one or more option devices in a layout for the circuit based on matching a pre-defined pattern set;
    determine where to place a second set of the one or more option devices in the layout for the circuit based on assigning option devices to pins; and
    determine whether to adjust the placement of option devices in the layout for the circuit based on predetermined criteria.

* * * * *